(12) United States Patent
Hara et al.

(10) Patent No.: US 9,209,054 B2
(45) Date of Patent: Dec. 8, 2015

(54) DEVICE MANUFACTURING APPARATUS

(75) Inventors: Shiro Hara, Ushiku (JP); Satoshi Haraichi, Tsukuba (JP); Akira Ishibashi, Sapporo (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 267 days.

(21) Appl. No.: 13/820,381

(22) PCT Filed: Aug. 30, 2011

(86) PCT No.: PCT/JP2011/069599
§ 371 (c)(1),
(2), (4) Date: Mar. 19, 2013

(87) PCT Pub. No.: WO2012/029775
PCT Pub. Date: Mar. 8, 2012

(65) Prior Publication Data
US 2013/0167339 A1     Jul. 4, 2013

(30) Foreign Application Priority Data
Sep. 1, 2010   (JP) ................................. 2010-195996

(51) Int. Cl.
*H01L 25/00* (2006.01)
*H01L 21/677* (2006.01)
(Continued)

(52) U.S. Cl.
CPC ...... *H01L 21/67703* (2013.01); *G05B 19/4188* (2013.01); *H01L 21/02* (2013.01);
(Continued)

(58) Field of Classification Search
CPC ......... H01L 25/00; H01L 27/00; H01L 27/08; H01L 21/02; H01L 21/67703; H01L 21/67727; Y10T 29/41; G05B 19/4188; G05B 2210/32395; G05B 2219/32396

USPC .................................. 29/564, 564.1
See application file for complete search history.

(56) References Cited

U.S. PATENT DOCUMENTS

2003/0185655 A1   10/2003  Uchimaki et al.
2006/0048686 A1    3/2006  Watanabe et al.
(Continued)

FOREIGN PATENT DOCUMENTS

JP      A-64-44035      2/1989
JP      A-3-264245      11/1991
(Continued)

OTHER PUBLICATIONS

Nov. 22, 2011 International Search Report issued in International Application No. PCT/JP2011/069599.
(Continued)

*Primary Examiner* — Carl Arbes
(74) *Attorney, Agent, or Firm* — Oliff PLC

(57) ABSTRACT

A device manufacturing method and a device manufacturing apparatus in a single wafer processing system with wafers in 0.5 inch size. A large number of sealed-type unit process apparatuses are arranged to form a manufacturing line. The unit process apparatus is portable and processes a single process in the manufacturing process. When the number of a unit of manufacturing is more than the number of the unit process apparatuses, the unit process apparatuses are arranged as a flow shop system, corresponding to the order of processes for the device. When the number of the units is nearly equal to the number of processes, the apparatuses are arranged as a class shop system for classified arrangement at every major division of orders of processes. When the number of the units is far less than the number of processes, the apparatuses are arranged as a multicell shop system.

7 Claims, 8 Drawing Sheets

(51) Int. Cl.
*H01L 21/02* (2006.01)
*G05B 19/418* (2006.01)

(52) U.S. Cl.
CPC *H01L21/67727* (2013.01); *G05B 2219/32395* (2013.01); *G05B 2219/32396* (2013.01); *Y10T 29/41* (2015.01)

(56) References Cited

U.S. PATENT DOCUMENTS

2007/0117400 A1   5/2007   Matsuoka et al.
2009/0326703 A1   12/2009  Presley et al.

FOREIGN PATENT DOCUMENTS

| JP | A-3-268104 | 11/1991 |
| JP | A-7-237095 | 9/1995 |
| JP | A-2000-315718 | 11/2000 |
| JP | A-2002-118042 | 4/2002 |
| JP | A-2005-197500 | 7/2005 |
| JP | A-2006-512628 | 4/2006 |
| JP | A-2008-227086 | 9/2008 |
| JP | A-2010-55245 | 3/2010 |
| KR | 1020040083711 A | 10/2004 |
| KR | 10-2006-0126538 | 7/2006 |
| KR | 2008044179 A * | 5/2008 |
| WO | WO 03/104113 A2 | 12/2003 |

OTHER PUBLICATIONS

Nov. 25, 2014 Office Action issued in JP Application 2013-189547.
"Minimal Manufacturing, Points of Ponder and Technology" complied by Task Force to Tackle with Technical Issue Related with Minimal Manufacturing, published Apr. 15, 2007, pp. 29-34 and 61-66. https://staff.aist.go.jp/shiro-hara/papers/minimalmanufacturingtech.pdf. National Institute of Advanced Industrial Science and Technology.
Hara, Shiro. "Creating Minimal Production System" AIST TODAY Feb. 2009, published Feb. 2009, pp. 10-11. https://staff.aist.go.jp/shiro-hara/papers/SHaraAISTTODAY0902-10.pdf.
Japanese Office Action issued in Japanese Patent Application No. 2013-189547 issued Jun. 24, 2014.
Sang-Jin Lee, "New Paradigm of Semiconductor Production in Japan", posted on May 25, 2010 http://www.globalwindow.org/gw/overmarket/GWOMAL020M.html?BBS_ID=10&MENU_CD=M10103&UPPER_MENU_CD=M10102&MENU_STEP=3&ARTICLE_ID=2119925 (with translation).
Office Action issued in Korean Patent Application No. 10-2013-7006451 dated Jun. 20, 2014 (with translation).
Feb. 5, 2015 Extended European Search Report issued in European Application No. 11821791.8.
Klesy,S. "Asic-Fertigung in Minizellen. Asic Manufacture in Minicells", F&M Feinwerktechnik Mikrotechnik Mikroelektronik, Hanser, Munchen, DE, vol. 105, No. 11/12, Nov. 1, 1997, pp. 805-807.

* cited by examiner

FIG. 7

SIZE EFFECT OF SEMICONDUCTOR SYSTEM

| | MEGAFAB | MINIMAL FAB 1 | MINIMAL FAB 2 | MINIMAL FAB 3 | MINIMAL FAB 4 |
|---|---|---|---|---|---|
| FAB TYPE | | FLOW SHOP | CLASS SHOP | MULTICELL | CELL |
| FLOOR SPACE OF FAB | 20,000m² | 360m² | 360m² | 360m² | 30m² |
| DIAMETER OF WAFER | 12 INCHES | 0.5 INCH | 0.5 INCH | 0.5 INCH | 0.5 INCH |
| NUMBER OF CHIPS/WAFER (1 cm² CHIP) | 600 | 1 | 1 | 1 | 1 |
| WIDTH OF APPARATUS | 3m | 30cm | 30cm | 30cm | 30cm |
| NUMBER OF MASKS | 34 | MASKLESS | MASKLESS | MASKLESS | MASKLESS |
| NUMBER OF PROCESSES | 600 | 400 | 400 | 20 TO 400 | 20 TO 200 |
| NUMBER OF PRODUCT TYPES PROCESSED AT THE SAME TIME | 500 TO 2000 | 1 | 2 TO 400 | 8 TO 16 | 1 TO 2 |
| NUMBER OF WAFERS IN PROGRESS | 17,000 | 400 | 400 | 16 | 2 |
| NUMBER OF APPARATUSES | 300 | 400 | 400 | 400 | 22 |
| AMOUNT OF FACILITY INVESTMENT | 300 BILLION YEN | 600 MILLION YEN | 600 MILLION YEN | 600 MILLION YEN | 50 MILLION YEN |
| LAYOUT OF APPARATUSES | JOB SHOP | FLOW | CLASS | MULTICELL | CELL |
| TOTAL CONVEYANCE DISTANCE | 50Km | 160m | 4km | DEPENDING ON THE NUMBER OF PROCESSES | DEPENDING ON THE NUMBER OF PROCESSES |
| OPERATION RATE OF WAFER (PROCESS TIME/TOTAL TIME) | LESS THAN 1% | 40% | 40% | 10% | 5% |
| OPERATING TIME PER DAY | 24 HOURS | 24 HOURS | 24 HOURS | 10 HOURS | 10 HOURS |
| PRODUCTION CAPACITY OF CHIPS PER YEAR | 140 MILLION | 500 THOUSAND | 200 THOUSAND | 1,500 | 100 |
| RESOURCE UTILIZATION EFFICIENCY | 0.10% | 0.20% | 0.20% | 0.20% | 0.20% |

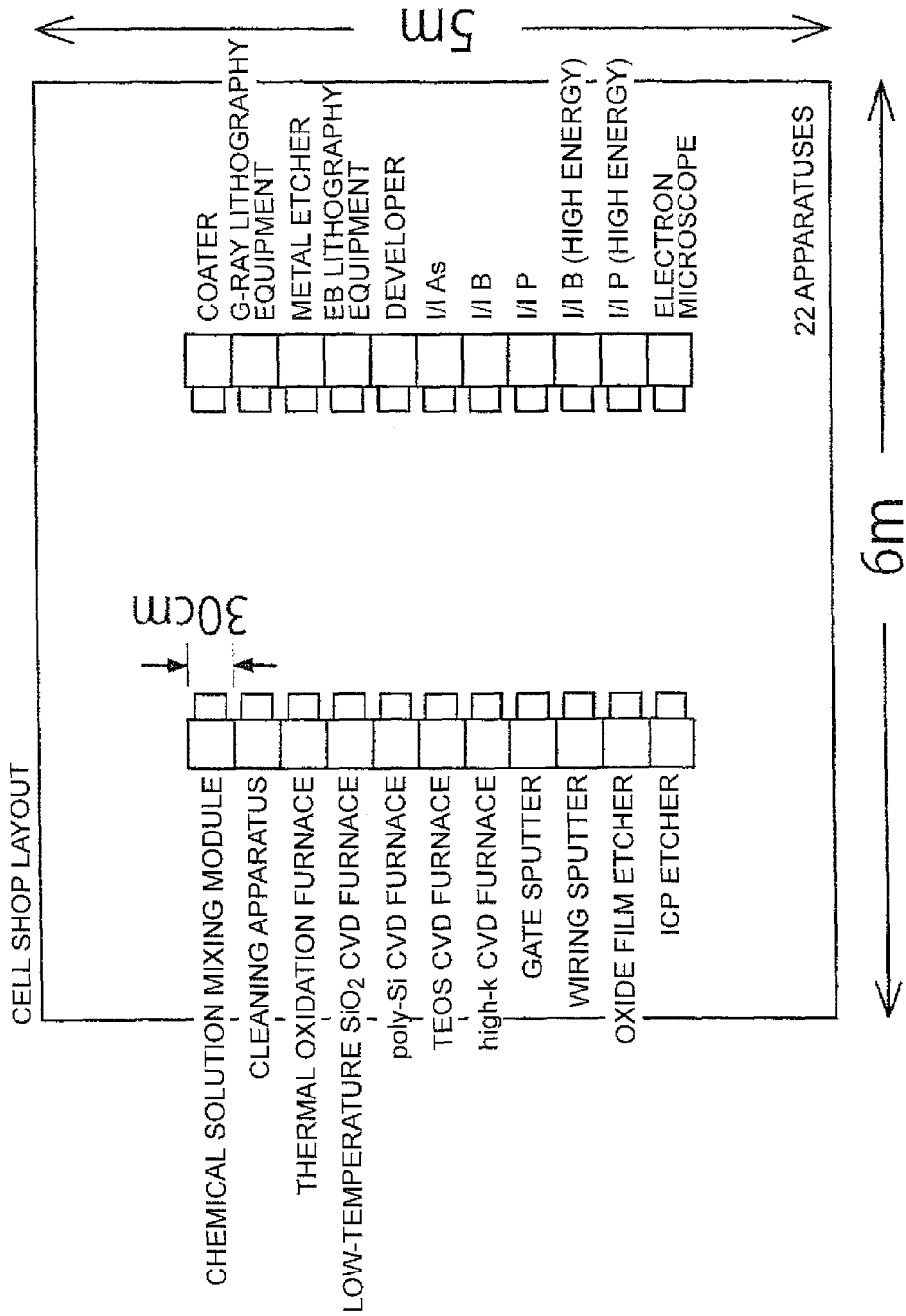

DEVICE MANUFACTURING APPARATUS

TECHNICAL FIELD

The present invention relates to a device manufacturing apparatus and a method for manufacturing the device, which are adapted for variable-product variable-quantity production of a semiconductor device or similar devices.

BACKGROUND ART

Recently, the mainstream of manufacturing lines for the semiconductor device has a layout where a job shop system is employed. The job shop system includes a plurality of units, which are referred to as bays and bring together processing apparatuses which have the same kind of functions, and connects the bays by a conveyance robot or a belt conveyor in a large clean room.

For a work processed in the manufacturing line, a large diameter wafer which has a diameter of, for example, 12 inches is used. The manufacturing system manufactures thousands of semiconductor chips from one sheet of the wafer.

However, in this job shop system, in the case where a plurality of similar processes is repeated, a conveyance distance inside a bay and among bays becomes substantially longer and waiting time is also longer. This causes increased manufacturing time, increased products in progress, or other factors which cause an increased cost. Thus, a problem of low productivity may arise in the manufacturing line for processing a large number of works.

In view of this, a manufacturing line by a flow shop system where semiconductor processing apparatuses are arranged in the order of processes has been proposed instead of the conventional manufacturing line by the job shop system.

On the other hand, a manufacturing line by the flow shop system is the most appropriate for a case where a large number of the same products are manufactured, however, in the case where a manufacturing procedure (recipe) needs to be changed to manufacture another product, it is necessary to rearrange the location of each semiconductor processing apparatus in the manufacturing line in the order of the process flow of the work. However, considering labors and time for the rearrangement, it is not realistic to rearrange the location in that way every time the product is changed. Especially, in the current situation where a huge semiconductor processing apparatus is fixed and disposed in a clean room which is a closed space, it is realistically impossible to rearrange the semiconductor processing apparatus in each case.

In conventional semiconductor manufacturing systems, the greatest importance has been placed on simultaneous productivity (amount of production per unit time) as a factor for minimizing the manufacturing cost. Thus, an increase in the diameter of a work size (silicon wafer size) and an increase in the number of the unit of manufacturing (number of orders for one type of product) have been prioritized, and a huge manufacturing system, so-called megafab has been oriented.

In this huge manufacturing system, the number of processes is more than several hundreds. In proportion to that number, the numbers of bays and apparatuses have been also increasing substantially.

Accordingly, a facility investment of several hundreds of billions of yen is required to establish such a megafab, and an aggregate investment has been becoming huge although the throughput of the entire manufacturing line has been improving.

Furthermore, as the manufacturing system has been becoming huge as described above, the control of the apparatus has been becoming complicated. Thus, conveyance time or waiting time in a conveyance system has been dramatically increasing. Accordingly, the number of wafers in progress which remain in the manufacturing line has been also dramatically increasing. Since the unit price of the large diameter wafer used here is very high, an increase in the number of wafers in progress causes an increase in cost.

In view of this, it is said that total productivity including the facility investment has already started to decrease under present circumstances, compared with a comparatively medium-scale manufacturing line where the wafer which has a smaller diameter than the current wafer is used.

FIG. 7 illustrates a size effect of a semiconductor manufacturing system in the megafab described above.

In the case of the currently most advanced semiconductor plant (megafab) where the wafer size is 12 inches, the number of apparatuses is 300, the number of wafers in progress which stay in the system is 17000, the number of masks to be used is 34, the floor space is 20000 square meters, and the amount of the facility investment is approximately 300 billion yen.

In this case, the production capacity per month is 140 million pieces per year when converted to the chip of 1 $cm^2$. The operation rate of the wafer is less than 1%, and the resource utilization efficiency is less than 0.1%. However, the prerequisite is as follows. The required time (cycle time) in each process is 1 minute per one wafer, the number of processes is 500 in the case of a metal 8 layer semiconductor, and the design rule is 90 nm.

On the other hand, there are needs to manufacture extremely small amount of semiconductors, for example, in several pieces to several hundreds of pieces, for an engineering sample, a ubiquitous sensor, or the like.

In the case of the manufacturing system which is not such a huge manufacturing system, this extremely small amount production can be performed such that the cost performance is not sacrificed much. However, if this extremely small amount production is performed in the manufacturing line of this huge manufacturing system, the cost performance becomes extremely low. Accordingly, another product type has to be processed in the manufacturing line at the same time.

However, if multiple product types are processed at the same time to perform a mix flow production, the productivity of the manufacturing line further decreases as the number of product types increases. In view of this, this huge manufacturing system cannot appropriately address the production for extremely small amount and multiple product types.

Regarding the device manufacturing system where the flow shop system or the job shop system is employed, various kinds of devices to address a decrease in an operation rate in the respective methods have been conventionally proposed (PATENT LITERATURE 1 or PATENT LITERATURE 2).

CITATION LIST

Patent Literature

PATENT LITERATURE 1: Japanese Unexamined Patent Application Publication No. 2005-197500.
PATENT LITERATURE 2: Japanese Unexamined Patent Application Publication No. 2008-227086.

SUMMARY OF INVENTION

Technical Problem

The inventions described in PLT 1 and PLT 2 improves the efficiency in the flow shop system or the job shop system.

However, they are not sufficient to ensure quality and high cost performance for any one of extremely small amount of production of multiple product types, and mass production of a single product type. That is, they are not sufficient to flexibly handle variable-product variable-quantity production.

An achievement of research and development contributes to society only after it is incorporated into an actual manufacturing system to be demonstrated. This also applies to the semiconductor category.

However, in order to be incorporated into a huge device manufacturing system such as a megafab, the achievement of research and development needs to be established as a production technology to be incorporated into a large-scale device manufacturing apparatus. Thus, more time and managerial resources are further required.

This is a so-called "valley of death" which lies between the research and development and the market. A current device manufacturing system has a problem that the achievement of research and development does not sufficiently contribute to society even though it is superior and is achieved with much effort.

Furthermore, regarding a conventional huge semiconductor manufacturing system, each manufacturing apparatuses is huge, and is not easily moved when placed in a plant. Accordingly, it is difficult to move the apparatus, and it is impossible to change the location to shorten the conveyance path of products. The apparatus needs to be maintained or repaired on site because it cannot be returned to the apparatus manufacturing factory. This causes difficulty which requires a large amount of travel expenses and personnel expenses and takes a lot of time. The hugeness of the apparatus is a major cause of the enormous price of the apparatus and the enormous manufacturing cost of products.

The present invention has been made in view of the actual situation described above, and its object is to provide a device manufacturing apparatus and a device manufacturing method which can flexibly handle variable-product variable-quantity production of manufacturing devices such as a semiconductor.

Another object of the present invention is to provide a device manufacturing apparatus and a device manufacturing method which can promptly and easily incorporate an achievement of research and development related to manufacturing of devices such as a semiconductor into an actual manufacturing line.

A further object of the present invention is to provide a device manufacturing apparatus and a device manufacturing method which can substantially reduce the price of apparatuses, the manufacturing cost of products, or the maintenance cost.

Solution to Problem

In order to achieve the objects described above, a device manufacturing apparatus according to the present invention includes a plurality of sealed-type unit process apparatuses, a sealed conveyance container, a wafer entry/exit front chamber, and conveyance means. The plurality of sealed-type unit process apparatuses is configured to process a single process in a device manufacturing process. The sealed conveyance container is configured to store one sheet of wafer as a work object. The wafer entry/exit front chamber is configured to pass the wafer between the unit process apparatus and the sealed conveyance container. The wafer entry/exit front chamber is disposed for each unit process apparatus. The conveyance means is configured to convey the sealed conveyance container between the wafer entry/exit front chambers.

The wafer to be stored in the sealed conveyance container has a wafer size for manufacturing a device in a minimized unit. The plurality of unit process apparatuses is portable. The plurality of unit process apparatuses is arranged as a flow shop system for arrangement corresponding to an order of processes for the device. In a case where the number of a unit of manufacturing of the device is nearly equal to the number of the unit process apparatuses, the unit process apparatuses are arranged as a class shop system for classified arrangement at every major division of orders of processes. In a case where the number of the unit of manufacturing is less than the number of the unit process apparatuses, the unit process apparatuses are arranged as a multicell shop system. The multicell shop system includes approximately one unit process apparatus arranged in one cell for one process type. The multicell shop system includes a plurality of the cells.

Here, "single process" means a unit of processes which can be stored in the capacity of one portable container. This includes not only one process in a conventional device processing process, but also a process including multiple conventional processes and other processes insofar as the process can be stored in the capacity of the container. The other processes include a process that has a plurality of conventional processes, and a process that is obtained by dividing a conventional process into multiple processes which are conventionally performed as one process.

In the present invention thus configured, each unit process apparatus is a processing apparatus to process a single process and is a portable apparatus, a wafer as a work object is defined to have a wafer size for manufacturing a device in a minimized unit, and the wafer is processed by the single wafer processing method to process one sheet by one sheet. This allows flexibly changing the layout of multiple unit process apparatuses in accordance with a change of manufacturing processes or the number of the unit of manufacturing. This allows improvement of production efficiency and quality of throughput as a device manufacturing apparatus.

The unit process apparatus processes assuming the process where the wafer size is a size for manufacturing the device in the minimized unit, and the unit process apparatus performs only a single process one sheet by one sheet. This condition is similar to a condition of a device processing apparatus in an experiment phase. Accordingly, an achievement of research and development in the experiment phase can be easily incorporated into the unit process apparatus. This allows promptly integrating research, development, and production. This makes it possible to overcome the so-called "valley of death".

Furthermore, since there is no need for a large clean room which houses a manufacturing line and there are other advantages, the energy efficiency for manufacturing is extremely better, and the operation efficiency of operators is also better than a conventional megafab.

The unit price of manufacturing this unit process apparatus itself is inexpensive, and there is no need to establish a manufacturing line in a clean room. Accordingly, even though a large number of unit process apparatuses need to be used, the manufacturing line can be established at a far lower price, compared with an establishment of the megafab.

Most of the conventional manufacturing apparatuses cannot be moved because they have, for example, a length of several meters and a weight of 10 tons. When the apparatus is actually carried in and out of a plant, the apparatus is often disassembled. Thus, a maintenance staff of a supplier of the manufacturing apparatus needs to visit the plant to maintain or repair the apparatus on site in the event of a fault or for maintenance. In the actual business scenes, this service is usually provided without charge, and the on-site service fee after purchase is normally added on the purchase price of the apparatus instead. Additionally, when the apparatus is repaired or maintained, a large amount of particulates are generated due to the work in some cases. Thus, in order to prevent the influence on the other manufacturing apparatuses, the line might be stopped.

In contrast, the unit process apparatus according to the present invention is downsized to reduce weight and to be portable. Thus, there is no need for an expensive on-site service, and the unit process apparatus can be sent back to the supplier of the apparatus. Furthermore, assuming maintenance or failure, alternative apparatuses may be preliminarily prepared in the plant. Accordingly, the required time for maintenance and repair of failure is extremely short, approximately one minute for replacement of the apparatuses. While the operation rate of the conventional plant decreases by the time of failure or maintenance, the decrease in the operation rate of the plant according to the present invention is close to zero and almost negligible. Thus, the operation rate can be improved to be close to the ultimate value, 100%.

Here, the case where the number of the unit of manufacturing varies from an extremely small amount to an extremely large amount is described.

In the case where the number of the unit of manufacturing is extremely small, for example, in the case where the number of orders is one, one cell shop meets the needs. That is, in an early phase of product manufacturing, especially in a prototyping phase or other phases, in the case where the number of orders is extremely small, semiconductors are manufactured in the multicell shop. If the number of orders for a certain product type or some product types may then increases, the layout can be changed to the class cell shop arrangement, where the manufacturing speed is faster. If the number of orders for a single product type further increases and only the product type are manufactured, the layout can be changed to the flow shop arrangement, where the unit process apparatuses are arranged in the order of the processing procedure (process recipe) of the product type. This can further improve the manufacturing speed. In the case where the received orders exceeds the manufacturing capacity of one flow shop, the flow shop is extended as a parallel flow shop system, where flow shops are arranged in parallel. This allows manufacturing semiconductors corresponding to the number of orders.

In the multicell shop, one unit process apparatus is arranged in one cell for one process type. For example, one cleaning apparatus is disposed per cell. Thus, in a manufacturing process of a semiconductor device where one process type such as a cleaning process is used multiple times, the unit process apparatus is used multiple times until the manufacturing of one device is completed. Typically, in each of the multiple uses, processing conditions (such as processing time, processing temperature, supplied amount of raw materials) are slightly different in a plurality of cases. In view of this, it is necessary to change the processing conditions for each process. Accordingly, the production efficiency decreases.

On the other hand, in the class shop, many unit process apparatuses are prepared for one process type. Accordingly, processing conditions which are appropriate to each of the multiple uses can be preliminarily set, and one unit process apparatus can be responsible for multiple uses of similar processing conditions. This allows the specification of the unit process apparatus where the functionality of the apparatus is specialized for a single function in accordance with the processing condition. It is useful because faster processing and a lower cost of the apparatus is achieved by specializing in a single function.

Furthermore, in the class shop system, the unit process apparatus group is grouped at every major division of orders of processes. For example, in the case of a device such as memory, CPU, system LSI, it can be divided and grouped into four major processes, which are a transistor gate process, a transistor source/drain process, a local wiring process, and a global wiring process. Once the gate process is finished, the process proceeds to the source/drain process and does not return to the gate process because the gate is already formed. A wafer is irreversibly conveyed among the four processes in this way. Accordingly, it is extremely advantageous to configure the unit manufacturing apparatus group in each of the four processes, for minimizing the conveyance distance.

In a conventional, general job shop, this grouping is not performed, and a cleaning apparatus is disposed in a cleaning bay and an etching apparatus is disposed in an etching bay. Only one process set performed for lithography, which includes cleaning, deposition, application, exposure, development, and etching, almost make a circuit of the plant. Actual manufacturing of the system LSI which needs approximately 600 processes requires conveyance for approximately 50 km to complete all processes. Since wafer contamination progresses during long distance conveyance, cleaning processes need to be inserted for every distance of approximately 0.5 km (in practice, conveyance distance required for one cycle of one process set for lithography). Accordingly, cleaning processes needs to be performed approximately 100 times, and inspection processes such as CD-SEM are also required each time.

In the class shop, the above-described unit process apparatus group required for one lithography, which includes cleaning, deposition, application, exposure, development, and etching, is optimally arranged in respective class bays. Thus, the conveyance distance is extremely short. Accordingly, total time required for entire manufacturing is substantially shortened, thus reducing the probability of the contamination due to conveyance. This allows the cleaning apparatuses and the inspection equipments to be substantially omitted. Additionally, since the present invention uses the unit process apparatus, which is far smaller than the processing apparatus used in a conventional megafab, the conveyance distance among the apparatuses is dramatically shortened compared with the megafab where one apparatus covers the area which is 100 times larger. While a system LSI needs 600 processes in the megafab, the number of the processes is reduced to approximately 400 processes in the class cell shop of the present invention. Total conveyance distance is shortened to approximately 4 km, while the megafab needs approximately 50 km.

This feature is even more remarkable in the flow shop according to the present invention. In this flow shop, the unit process apparatuses are arranged in the order of the process flow. Thus, the total conveyance distance is only 160 m. Accordingly, this flow shop not only shortens the manufacturing time substantially, but also almost eliminates the need for the cleaning apparatuses and the inspection equipments and also significantly improves the yield rate at the same time.

Additionally, in order to achieve the objects described above, in the device manufacturing apparatus according to the present invention, the unit process apparatuses each have a standardized outline.

With the present invention thus configured, each unit process apparatus has a standardized outline. This facilitates conveyance, positioning tasks, or similar tasks for the unit process apparatus, which are associated with a layout change. The configuration for connecting each unit process apparatus to outside, the configuration of the conveyance means for conveying the sealed conveyance container, or the configuration for arranging the unit process apparatuses can be also standardized. This allows reducing the cost of the device manufacturing apparatus itself. Furthermore, a conveyance control of the sealed conveyance container can be also simplified or streamlined.

Additionally, in order to achieve the objects described above, the device manufacturing apparatus according to the present invention further includes a layout apparatus configured to arrange the plurality of unit process apparatuses as the flow shop system, the class shop system, or the multicell shop system, based on the number of the unit of manufacturing and a recipe required for processing the unit of manufacturing.

With the present invention thus configured, since the unit process apparatus is configured to be portable, the plurality of unit process apparatuses can be easily rearranged as the flow shop system, the class shop system, or the multicell shop system by using the layout apparatus.

Additionally, in order to achieve the objects described above, in the device manufacturing apparatus according to the present invention, a plurality of manufacturing lines is disposed as the flow shop system depending on the number of the unit of manufacturing.

With the present invention thus configured, even though the number of the unit of manufacturing is several thousands of pieces or several hundreds of thousands of pieces, simply extending the manufacturing lines of the flow shop is enough, and there is no need for a large clean room. Accordingly, an enormous amount of facility investment is not necessary, unlike the megafab.

Additionally, in order to achieve the objects described above, in the device manufacturing apparatus according to the present invention, the minimized unit is one, and the wafer size is 0.5 inch in diameter.

With the present invention thus configured, a work object is one wafer for one device for single wafer processing. This allows simplifying the unit process apparatus, the sealed conveyance container, the wafer entry/exit front chamber, the conveyance means, and other units. This allows the manufacturing line to be established at a far lower price.

Additionally, in order to achieve the objects described above, a device manufacturing method for manufacturing a device according to the present invention uses a wafer with a wafer size for manufacturing a device in a minimized unit. The device manufacturing method use a plurality of sealed-type unit process apparatuses configured to process a single process in a device manufacturing process. The plurality of unit process apparatuses is portable. In a case where the number of a unit of manufacturing of the device is more than the number of the unit process apparatuses, the plurality of unit process apparatuses is arranged as a flow shop system for arrangement corresponding to an order of processes for the device. In a case where the number of the unit of manufacturing of the device is nearly equal to the number of the unit process apparatuses, the unit process apparatuses are arranged as a class shop system for classified arrangement at every major division of orders of processes. In a case where the number of the unit of manufacturing is less than the number of the unit process apparatuses, the unit process apparatuses are arranged as a multicell shop system. The multicell shop system includes approximately one unit process apparatus arranged in one cell for one process type. The multicell shop system includes a plurality of the cells.

With the device manufacturing method according to the present invention thus configured, since the unit process apparatus configured to process a single process is standardized and is a portable apparatus. This allows flexibly and easily changing the layout of the unit process apparatuses in accordance with a change of manufacturing processes or the number of the unit of manufacturing. This allows improvement of production efficiency and quality of throughput as a device manufacturing apparatus.

In the device manufacturing method according to the present invention, a wafer as a work object is defined to have a wafer size for manufacturing a device in a minimized unit. This condition is similar to a condition of a device processing apparatus in an experiment phase. Accordingly, an achievement of research and development in the experiment phase can be easily incorporated into the unit process apparatus. This allows promptly integrating research, development, and production. This makes it possible to overcome the so-called "valley of death".

Furthermore, since the device manufacturing method according to the present invention does not require a large clean room which houses a manufacturing line and there are other advantages, the energy efficiency of throughput for manufacturing is extremely better and the operation efficiency of operators is also better than a conventional megafab.

With the device manufacturing method according to the present invention, the unit price of manufacturing this unit process apparatus itself is inexpensive, and there is no need to establish a manufacturing line in a clean room. Accordingly, even though a large number of unit process apparatuses need to be used, the manufacturing line can be established at a far lower price, compared with an establishment of the megafab.

Additionally, in order to achieve the objects described above, in the device manufacturing method according to the present invention, the unit process apparatuses each have a standardized outline.

With the present invention thus configured, each unit process apparatus has a standardized outline. This facilitates conveyance, positioning tasks, or similar tasks for the unit process apparatus, which are associated with a layout change. The configuration for connecting each unit process apparatus to outside, the configuration of the conveyance means for conveying the sealed conveyance container, or the configuration for arranging the unit process apparatuses can be also standardized. This allows reducing the cost of the device manufacturing apparatus itself. Furthermore, a conveyance control of the sealed conveyance container can be also simplified or streamlined.

Furthermore, in order to achieve the objects described above, in the device manufacturing method according to the present invention, the minimized unit is one, and the wafer size is 0.5 inch in diameter.

With the present invention thus configured, a work object is one wafer for one device for single wafer processing. This allows simplifying the unit process apparatus, the sealed conveyance container, the wafer entry/exit front chamber, the conveyance means, and other units. This allows the manufacturing line to be established at a far lower price.

Advantageous Effects of Invention

The present invention can flexibly handle the varied number of the unit of manufacturing. That is, a layout can be changed extremely easily among the flow shop layout, the class shop layout, and the multicell shop layout. This enables each manufacturing apparatus not to be in a non-operational state, and a flexible device manufacturing apparatus and method, which is tolerant of economic change or economic upturn and downturn, can be achieved.

Furthermore, according to the present invention, the unit process apparatus and the inside of the conveyance system are sealed from the work space for operators. This eliminates the need for a clean room which houses the entire device manufacturing apparatus and improves the operation efficiency of operators. Since the wafer to be processed has a wafer size in a minimized unit and there is no need for a clean room, the energy efficiency for manufacturing is extremely better than a conventional megafab.

Additionally, an achievement of research and development can be easily incorporated into an actual manufacturing apparatus, even though it is an achievement in an experiment phase. Accordingly, this allows promptly integrating research, development, and production.

BRIEF DESCRIPTION OF DRAWINGS

FIG. 7 is a table illustrating size effects of semiconductor systems.

FIG. 8 is an exemplary arrangement (in a cell shop layout) of the manufacturing line using the unit process apparatus according to the exemplary embodiment of the present invention.

DESCRIPTION OF EMBODIMENTS

The following describes an exemplary embodiment of the present invention by taking semiconductor device manufacturing as an example and by referring to the accompanying drawings.

Figure 2:
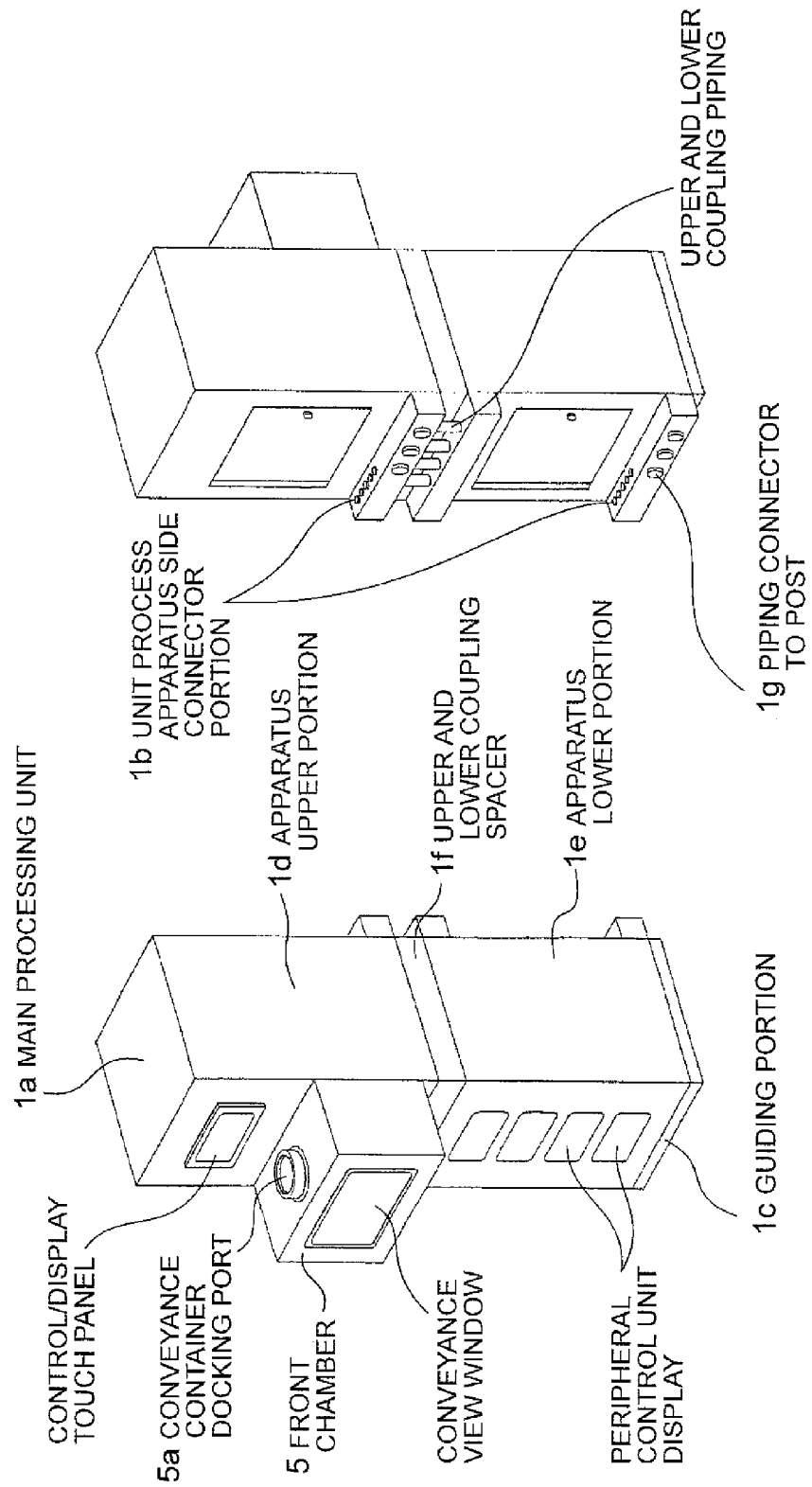
FIG. 2 is a perspective view of a unit process apparatus used for the manufacturing line according to the exemplary embodiment of the present invention.

FIG. 2 is a perspective view of a unit process apparatus 1. The perspective view on the left side is a perspective view, viewed from a wafer entry/exit front chamber 5 side. The wafer entry/exit front chamber 5 is used for carrying a wafer in and out of the unit process apparatus 1. The perspective view on the right side is a perspective view, viewed from the opposite side of the wafer entry/exit front chamber 5. As illustrated in FIG. 2, the unit process apparatus 1 includes a main processing unit 1a, an apparatus lower portion 1e, and an upper and lower coupling spacer 1c. The main processing unit 1a is an apparatus upper portion 1d, which has a working space for performing a single process. The apparatus lower portion 1e includes a raw material supplying system, an exhaust system, a control unit, or similar systems for the main processing unit 1a. The upper and lower coupling spacer 1c couples the main processing unit 1a (apparatus upper portion 1d) with the apparatus lower portion 1e. With use of the upper and lower coupling spacer 1f, the main processing unit 1a and the apparatus lower portion 1e are configured to be separated from each other as necessary.

This unit process apparatus 1 has an outline standardized to be an approximately rectangular parallelepiped. In the lower part of the apparatus lower portion 1e, casters (not shown) are disposed as transportation means for moving the unit process apparatus 1. Thus, the unit process apparatus 1 is configured to be moved as necessary.

On the apparatus lower portion 1e, a unit process apparatus side connector portion 1b is also disposed. The connector portion 1b brings together the raw material supplying piping, an exhaust pipe, a control signal line, and a power line, or the like to be coupled to a post, which is described later, via a piping connector 1g. The raw material supplying piping supplies a raw material used in the main processing unit 1a, such as cleaning fluid, cleaning gas, and raw material gas from an external raw material supplying source. The exhaust pipe is used for discharging emissions from the main processing unit 1a. The control signal line connects with an external central control unit, and the power line connects with an external power source.

Additionally, the apparatus lower portion 1e includes a guiding portion 1c used for positioning the unit process apparatus 1 at the predetermined position when the unit process apparatus 1 is moved.

The main processing units 1a each have the same outline standardized to be a desktop size. The main processing unit 1a includes a door portion (not shown) on the side surface on which the wafer entry/exit front chamber 5, which is described later, is disposed. Through the door portion, the wafer entry/exit front chamber 5 and the main processing unit 1a are spatially connected, and the wafer can temporarily pass.

Here, "desktop size" means a size which can be conveyed comparatively easily by hand, and it specifically means an approximately rectangular parallelepiped where one side has a length of approximately 70 cm at most.

According to this exemplary embodiment, the unit process apparatus 1 has an approximately rectangular parallelepiped shape, which is standardized to have a width and depth of approximately 30 cm and a height of approximately 140 cm. The weight varies by each of the unit process apparatuses 1, and is normally considered to be approximately 60 kilograms. In the unit process apparatus 1, the main processing unit 1a has the desktop size of an approximately rectangular parallelepiped shape, which is standardized to have a width and depth of approximately 30 cm and a height of approximately 70 cm. The weight of the main processing unit 1a is normally considered to be approximately 30 kilograms.

Accordingly, only the main processing unit 1a can be separated from the unit process apparatus 1 and easily conveyed. Thus, the main processing unit 1a can be easily separated and moved to a required place in that manner, and then the functions as the unit process apparatus 1 can be easily checked, repaired, and improved.

As described above, "single process" means one group of processes, which can be put within the capacity of one desktop size container. This will be specifically described with an example.

An actual wafer process of the semiconductor device mainly includes processes such as cleaning, application, exposure, development, etching, deposition (for example, CVD, sputtering), impurity control (for example, ion implantation, spreading), inspection, CMP (polishing). Each process includes more detailed element processes. For example, a cleaning process of a silicon wafer is an inclusive term for the following process group.

(1) ultrapure water cleaning (rough cleaning), (2) SPM (Sulfuric acid-Hydrogen Peroxide Mixture) cleaning (organic matter removal), (3) ultrapure water cleaning (rinsing), (4) $NH_4OH$—$H_2O_2$—$H_2O$ (SC-1) cleaning (particulate removal), (5) diluted Hydrogen fluoride cleaning (attached particulate removal by oxide removal), (6) HCl—$H_2O_2$—$H_2O$ (SC-2) cleaning (metal atom removal), (7) diluted Hydrogen fluoride cleaning (oxide removal), (8) ultrapure water cleaning (rinsing), (9) IPA (Isopropyl Alcohol) vapor drying (water vapor removal).

According to the exemplary embodiment, one unit process apparatus may perform this sequence of cleaning processes of (1) to (9), or two unit process apparatuses may be configured such that one unit process apparatus performs the organic matter removal of (1) and (2), and the other unit process apparatus performs the particulate removal and the metal atom removal of (3) to (9).

An application process, which is an example of another process in the semiconductor process, is an inclusive term for (a) surface treatment, (b) resist application, and (c) prebake (resist hardening). In these processes, (a) is a hydrophilicity/hydrophobicity control process of the wafer surface. Thus, the surface treatment (a) can be performed by the unit process apparatus which performs (3) to (9) in the cleaning process described above.

As described above, according to the present invention, the unit process apparatus 1 basically brings together the element processes which perform similar processing methods, and handles those processes in one unit process apparatus 1. Even though the processing methods are very different from one another, one unit process apparatus 1 may handle two consecutive processes insofar as it is technically advantageous that those two consecutive processes are handled in the same apparatus.

For example, it is preferred that the IPA vapor drying process (9) after the rinsing process (8) in the above-described cleaning process be performed in one unit process apparatus after the process (8), when possible. It is because residual moisture on the wafer has an action to etch atoms on the wafer surface in the atomic scale. This causes a problem that etching residue condenses as a watermark if it is left as it is. In order to prevent this problem, the IPA vapor drying needs to be performed before the etching proceeds.

As described later, an object which is processed by this unit process apparatus 1 is a semiconductor device in a minimized unit, which has a wafer size for manufacturing one semiconductor device from the wafer in 0.5 inch size according to an exemplary embodiment. One wafer is processed at a time. In other words, the process in the level similar to that of the semiconductor processing apparatus in an experiment phase is performed. Accordingly, even a research and development achievement in the experiment phase in a research laboratory can be easily introduced as a processing unit in the unit process apparatus 1.

The main processing unit 1a is of a sealed type, which can shut off external air. Use of a local cleaning unit, which is included in the apparatus lower portion 1e or is disposed outside of the unit process apparatus 1, allows performing inside cleaning. Since the inner volume of the main processing unit 1a is extremely small, the local cleaning unit can function very efficiently.

In other words, the present invention allows only the inside of the unit process apparatus 1 to be a clean room. This is inherently different from the conventional system for placing the entire manufacturing line in the clean room.

According to the present invention, the unit process apparatus 1 needs to be vacuumized depending on the content of the process. Since the inner volume of the main processing unit 1a is extremely small, the main processing unit 1a can also be vacuumized very efficiently.

Next, a description will be given of a semiconductor manufacturing apparatus and a method for manufacturing the semiconductor using the unit process apparatus 1.

Figure 1:
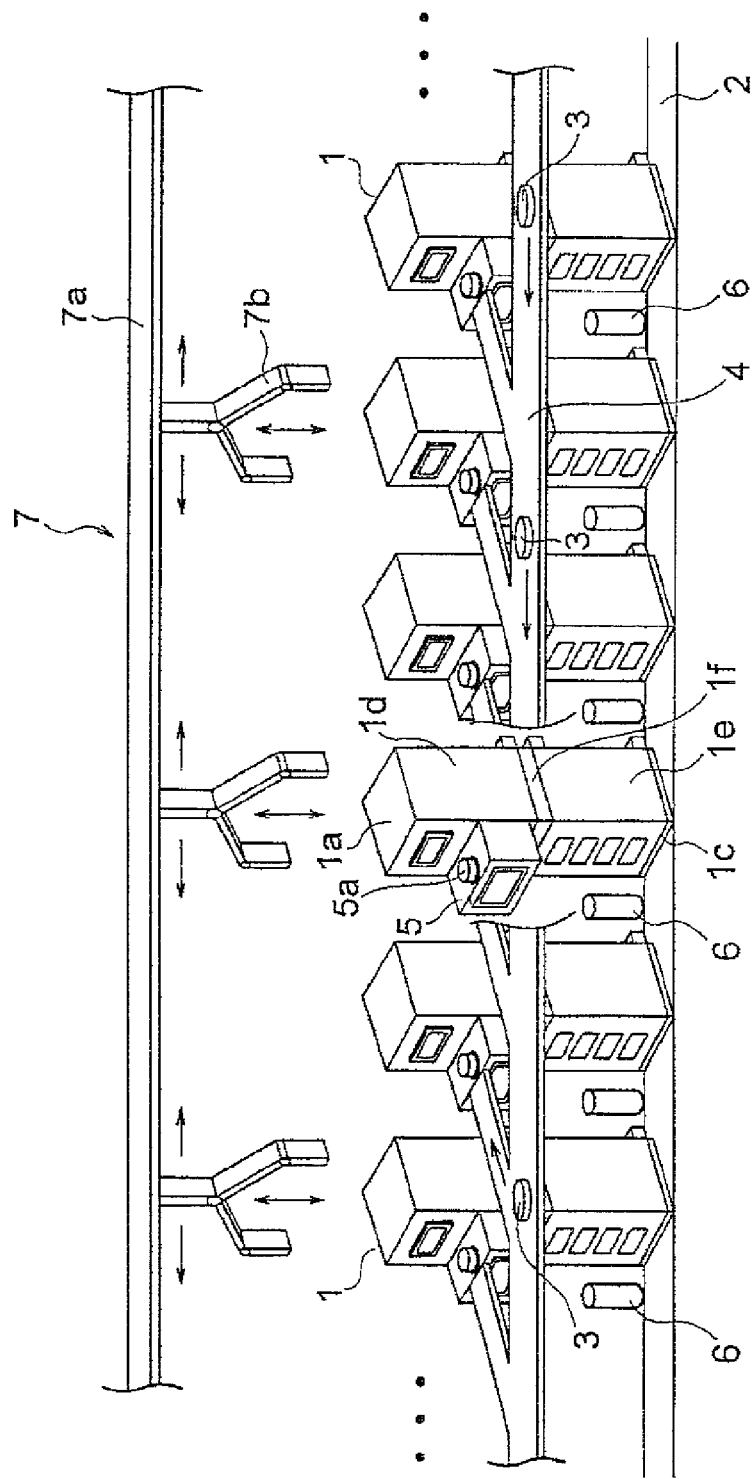
FIG. 1 is an enlarged explanatory drawing of a part of a manufacturing line according to an exemplary embodiment of the present invention.

As illustrated in FIG. 1, the guiding portion 1c of each unit process apparatus 1 is placed on a guideway 2 formed in a rail-shape to form the manufacturing line. Accordingly, each unit process apparatus 1 is positioned on the same semiconductor manufacturing line which is preliminarily configured on the floor. In a normal state, each unit process apparatus 1 is arranged in the guideway 2 in the order of a recipe in the flow shop system. In an exemplary arrangement of the unit process apparatuses 1 in FIG. 1, the unit process apparatuses 1 are regularly arranged at predetermined intervals. However, the unit process apparatuses 1 may be closely arranged without intervals.

On the outer surface of each unit process apparatus 1, a recipe ID is recorded to identify what type of a single process (process corresponding to the recipe) in the process is performed by the unit process apparatus 1. RFID (radio frequency ID) is employed to record the recipe ID to make it possible to easily write and read the information in a non-contact state in accordance with a change of the recipe for the unit process apparatus 1 or the like.

In parallel to the guideway 2, conveyance means 4 is disposed to convey a sealed conveyance container 3 for storing the wafer. For the conveyance means 4, the mechanism such as a belt-type mechanism and a mechanical mechanism, which is ordinarily employed for the semiconductor manufacturing apparatus, may be employed.

The conveyance means 4 is configured to convey the sealed conveyance container 3 between the wafer entry/exit front chambers 5, which are disposed for each unit process apparatus 1 and described later.

Figure 3:
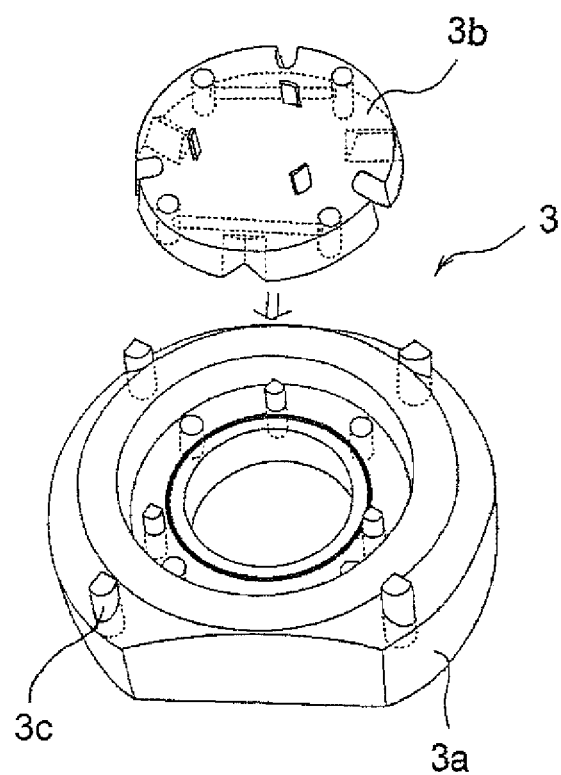
FIG. 3 is an exploded perspective view of a sealed conveyance container used for the manufacturing line according to the exemplary embodiment of the present invention.

As illustrated in FIG. 3, the sealed conveyance container 3 is configured to store one sheet of the wafer which has a diameter of 0.5 inch and to be sealed.

The sealed conveyance container 3 includes an upper storing portion 3a and a lid portion 3b. One sheet of the wafer is placed on the depressed center portion of the upper storing portion 3a, and the lid portion 3b is positioned and stored into the upper storing portion 3a from the lower side. This configuration makes the wafer to be separated from the external air. Reference numeral 3c denotes a protrusion for positioning the sealed conveyance container 3 on a docking port 5a of the wafer entry front chamber 5, which is described later.

The sealed conveyance container 3 has an RFID in which the recipe ID required for the wafer process is written along with the processing order of the recipe. Based on the recipe ID thus written, the conveyance means 4 is controlled to select the unit process apparatus 1 which has the desired recipe ID. The sealed conveyance container 3 is configured to be automatically moved to the selected unit process apparatus 1.

The wafer which is used in this system has a diameter of 0.5 inch, and one semiconductor device which has an area of 1 $cm^2$ (square centimeter) can be manufactured from this wafer. That is, this system is characterized by the use of the wafer in the wafer size in which the semiconductor device in the minimized unit is manufactured and the adoption of the processing method which processes one sheet by one sheet of the wafer using the single wafer processing.

The wafer entry/exit front chamber 5, which passes the single sheet of the wafer between the unit process apparatus 1 and the sealed conveyance container 3, is connected to each unit process apparatus 1.

The wafer entry/exit front chamber 5 has the standardized outline and the identical configuration. The wafer entry/exit front chambers 5 are disposed at the predetermined position with respect to any unit process apparatuses 1, and are configured to function in the same manner. Thus, a connecting portion (not shown) for connecting to and holding the wafer entry/exit front chamber 5 is disposed at a predetermined position of each unit process apparatus 1.

The wafer entry/exit front chamber 5 has a function similar to the load-lock chamber and the unload-lock chamber which are disposed in the processing chamber for the conventional semiconductor manufacturing apparatus. As illustrated in FIG. 2, a docking port 5a for connecting to the sealed conveyance container 3 is disposed on the wafer entry/exit front chamber 5. Additionally, a conveyance view window may be disposed on the side face.

The wafer entry/exit front chamber 5 includes carry-in means and carry-out means inside. The carry-in means brings a wafer out of the sealed conveyance container 3 placed on the docking port 5a, and carries the wafer into the main processing unit 1a, which shuts off external air. The carry-out means carries out the wafer processed in the main processing unit 1a, and stores it in the sealed conveyance container 3 again. The power for these carry-in means and carry-out means is provided from the corresponding unit process apparatus 1.

On the floor where a manufacturing line is installed, posts 6 are arranged at predetermined intervals along the manufacturing line. The post 6 is used to supply control signals, electric power, raw materials or the like to the unit process apparatus 1, and to discharge cleaning gas, cleaning water, or the like from the unit process apparatus 1. The post 6 is configured to connect to the piping connector 1g of the unit process apparatus 1 through a receptacle outlet. The connection through the receptacle outlet facilitates the supply of the raw materials, electric power, control signals, or the like even if the unit process apparatuses 1 are rearranged.

Furthermore, as illustrated in FIG. 1, above the semiconductor manufacturing line thus configured, a layout apparatus 7 for rearranging the unit process apparatus 1 is disposed.

This layout apparatus 7 includes a guide rail 7a, which is disposed in parallel to the guideway 2, and a unit process apparatus transfer portion 7b, which is hung down from the guide rail 7a and moves.

This layout apparatus 7 includes a reading mechanism for the recipe ID of each unit process apparatus 1. The layout apparatus 7 is configured to select the unit process apparatus 1 which has the predetermined recipe ID corresponding to the control signal from the central control unit, and to grip and transfer the selected unit process apparatus 1 using the unit process apparatus transfer portion 7b so as to rearrange the selected unit process apparatus 1 at the predetermined position.

The layout apparatus 7 is appropriate to promptly change the layout of many unit process apparatuses 1. However, it needs the facility cost for the layout apparatus. In the case where it is allowed to take time to change the layout, the unit process apparatus 1 may be conveyed by hand to eliminate the facility cost for the layout apparatus. For the conveyance by hand, the caster, which is disposed at the guiding portion 1c on the bottom portion of the unit process apparatus 1 as described above, is utilized.

Figure 4:
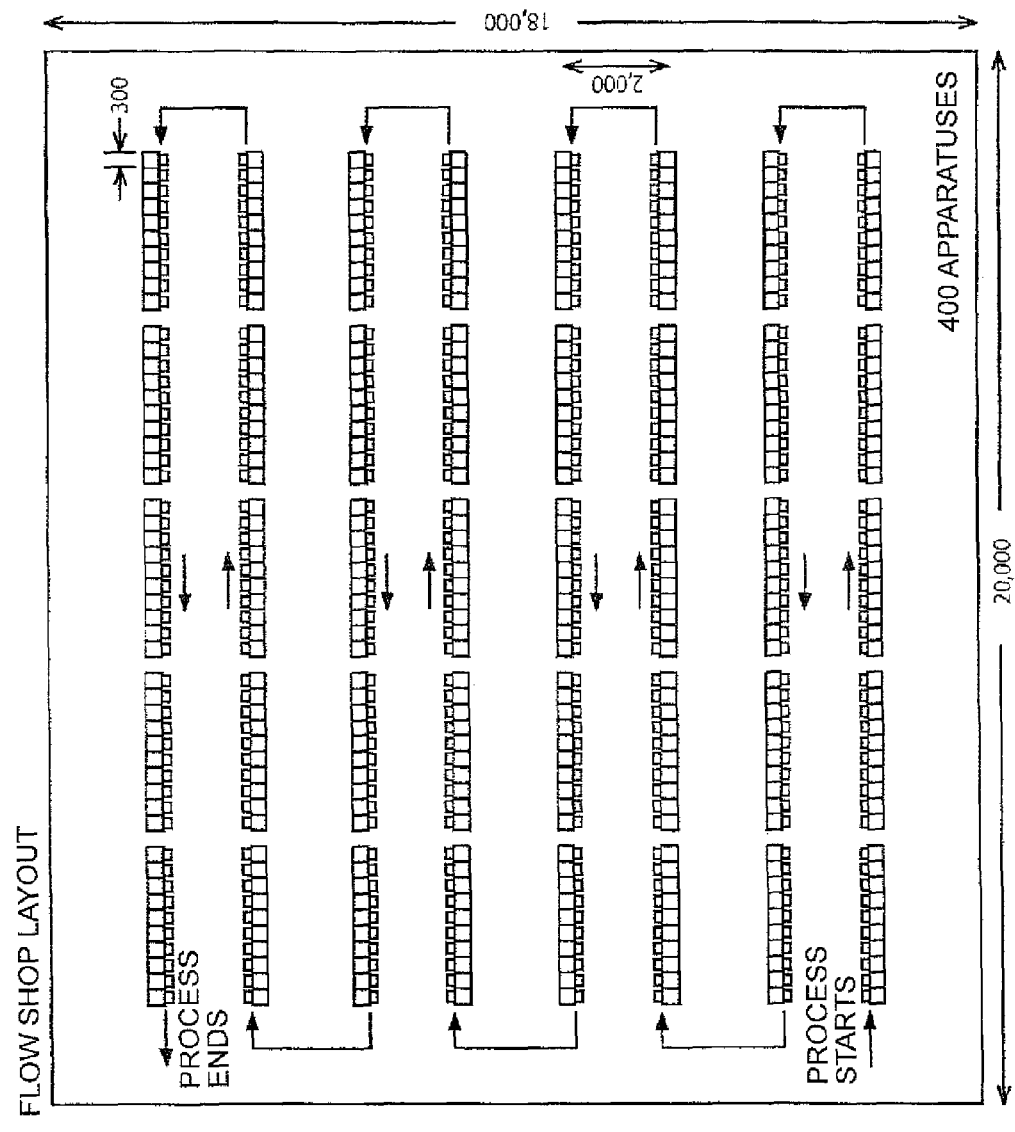
FIG. 4 is an exemplary arrangement in a flow shop system of the manufacturing line according to the exemplary embodiment of the present invention.

FIG. 4 illustrates an exemplary arrangement for mass production of the semiconductor manufacturing line according to this exemplary embodiment.

As described above, since the present invention is characterized by the single wafer processing of one-wafer-for-one-device, an area of the wafer is very small. Thus, the maskless system (direct lithography method to the wafer), which takes time for the lithography, can be optimally applicable. The cleaning process and the inspection process can be substantially reduced, and other advantages can be taken. Accordingly, when manufacturing metal 8 layer semiconductors as a prerequisite, 600 processes performed in a conventional megafab can be shortened to approximately 400 processes. Thus, the number of the unit process apparatuses may be in accordance with the number of the processes.

Accordingly, according to this exemplary arrangement (minimal fab 1), in an ordinary building, which is not equipped as a clean room, 400 unit process apparatuses 1 are arranged in an order of the process in the flow shop system.

The central control unit is disposed to control the entire manufacturing line. The central control unit writes the recipe ID into the RFID of the sealed conveyance container 3, controls the conveyance means 4 and the layout apparatus 7, controls the recipe in each unit process apparatus 1, and performs other tasks based on the number of the unit of manufacturing or their recipe.

In the exemplary arrangement (flow shop layout) in FIG. 4, as shown as "Minimal fab 1" in FIG. 7 compared with a megafab of the conventional type, the wafer size is 0.5 inch, the number of wafers in progress which stay in the system is 400, the number of masks to be used is zero, and the floor space is 360 square meters (18 m×20 m). The amount of the facility investment is only approximately 600 million yen (assuming the each unit process apparatus itself costs one million yen to five million yen).

In this case, the production capacity is approximately 500 thousand pieces per year when converted to the chip of $1 \text{ cm}^2$. The operation rate of the wafer is 40%, and the resource utilization efficiency is 0.2%.

Accordingly, in order to have the production capacity comparable to the number of production in the megafab per year, which is approximately 140 million pieces, 280 (=140 million/0.5 million) lines of the manufacturing lines in this exemplary arrangement need to be prepared. However, considering the actual operation rate of the megafab, approximately $\frac{1}{10}$ of that seems to be sufficient in practice. In the case of the multiflow shop with 28 lines, the amount of the facility investment is approximately 17 billion yen (28 lines×600 million yen) as a result of simple calculation. This is less than 10% of the investment amount of the megafab, which is 300 billion yen.

The unit price of the 0.5 inch wafer is very low and the number of the wafer in progress, which is 400, is also extremely small. Thus, the cost of the materials in progress is extremely small and negligible compared with the megafab.

Furthermore, comparing the energy efficiency required for manufacturing one device with the megafab, the power energy for the clean room is approximately $\frac{1}{10}$, the energy efficiency of the unit process apparatus is approximately $\frac{17}{100}$ as a result of the local process to the minimal wafer or other processes, and other advantages can be taken. Accordingly, the present invention can improve the energy efficiency for the entire plant to be approximately $\frac{14}{100}$ compared with the megafab.

In the exemplary embodiment described above, the number of the processes is 400. The number of the processes can be further reduced.

That is, according to the present invention, even if microfabrication accuracy, which is not most-advanced at this time, is employed in the design rule, the system can be the one which is not inferior to the most-advanced one at all. This can eliminate the need for the current CMP (Chemical Mechanical Polishing) process. In the CMP process, a large amount of particulates is generated by polishing. When the CMP process is omitted, the particulates are not generated in the CMP process. Thus, cleaning apparatuses and inspection equipments can be substantially omitted. In a conventional mega-fab system (including approximately 600 processes), the cleaning apparatuses and inspection equipments are used in 30% of the processes. The proportion of these equipments can be reduced to be approximately 5% of the processes. This can omit 150 (=600×0.25) processes.

In the wiring process, the processes related to the CMP process can also be omitted. The wiring process makes up approximately ⅔ of all processes. Approximately 30% of the wiring process is related to the CMP process. This can be reduced to be approximately 5% by omitting the CMP process even though new processes need to be added. Accordingly, 100 (=600×⅔×0.25) processes can be omitted.

In the wiring process, the processes related to the CMP process can also be omitted. The wiring process makes up approximately ⅔ of all processes. Approximately 30% of the wiring process is related to the CMP process. This can be reduced to be approximately 5% by omitting the CMP process even though new processes need to be added. Accordingly, 100 (=600×⅔×0.25) processes can be omitted.

Furthermore, a plasma etching process or an IPA drying process for removing dirt attached during conveyance conventionally makes up approximately 5% of all processes. However, with the present invention, these processes are not necessary because dirt is hardly attached during conveyance. Accordingly, 30 (=600×0.05) processes can be omitted.

As a result of the omission of these processes, the number of processes can be reduced to approximately 320 (=600−150−100−30) processes. This can reduce the number of the unit process apparatuses. Accordingly, the amount of the facility investment can also be reduced.

To maximally take advantage of the feature of "the single wafer processing of one-wafer-for-one-device" according to the present invention, a litho-less system is more effective. The litho-less system is a system where the lithograph process is further omitted from the maskless system described above.

By employing this litho-less system, the number of processes can be further reduced to 22 processes, as illustrated in a cell shop system in FIG. 8, from 320 processes described above. Thus, the number of the unit process apparatuses can be 22, and the amount of the facility investment can be further reduced to 50 million yen, as shown as "Minimal fab 4" in FIG. 7.

As described above, the semiconductor manufacturing apparatus and the semiconductor manufacturing method according to the present invention are based on a technological thought which is different from the conventional "mega-fab", and establish a semiconductor manufacturing apparatus and a semiconductor manufacturing method which are based on a completely new concept. This can be called "the minimal fab".

Assume that semiconductors are manufactured in the above-described exemplary arrangement as the flow shop system, and the number of the unit of manufacturing (number of orders) is several pieces to several tens of pieces.

In this case, the number of the unit process apparatuses is more than the number of the unit of manufacturing. This causes very few wafers in progress, that is, many unit process apparatuses which is not in operation. Rather, the processing efficiency of the entire manufacturing line is reduced.

In view of this, it is advantageous to reduce the number of the unit process apparatuses in the case of such a unit of manufacturing. In this case, it is preferred to manufacture the devices one by one in a cell shop as illustrated in FIG. 8.

A problem is caused in the case where the number of orders is drastically reduced due to an economic downturn or other reason in a large plant where a large number of unit process apparatuses are introduced. From a viewpoint of the operation rate of the facility, it is disadvantageous to scrap apparatuses or leave apparatuses unused.

In such a time of economic downturn, new products (devices) should normally be developed, prototyped, and sold in a small amount toward the next economic upturn phase. Since it is not predictable what becomes a big seller, making many prototypes or selling in a small amount will be attempted. Accordingly, it is preferred to prepare many fabs in a small unit, which is suited to prototyping.

Figure 6:
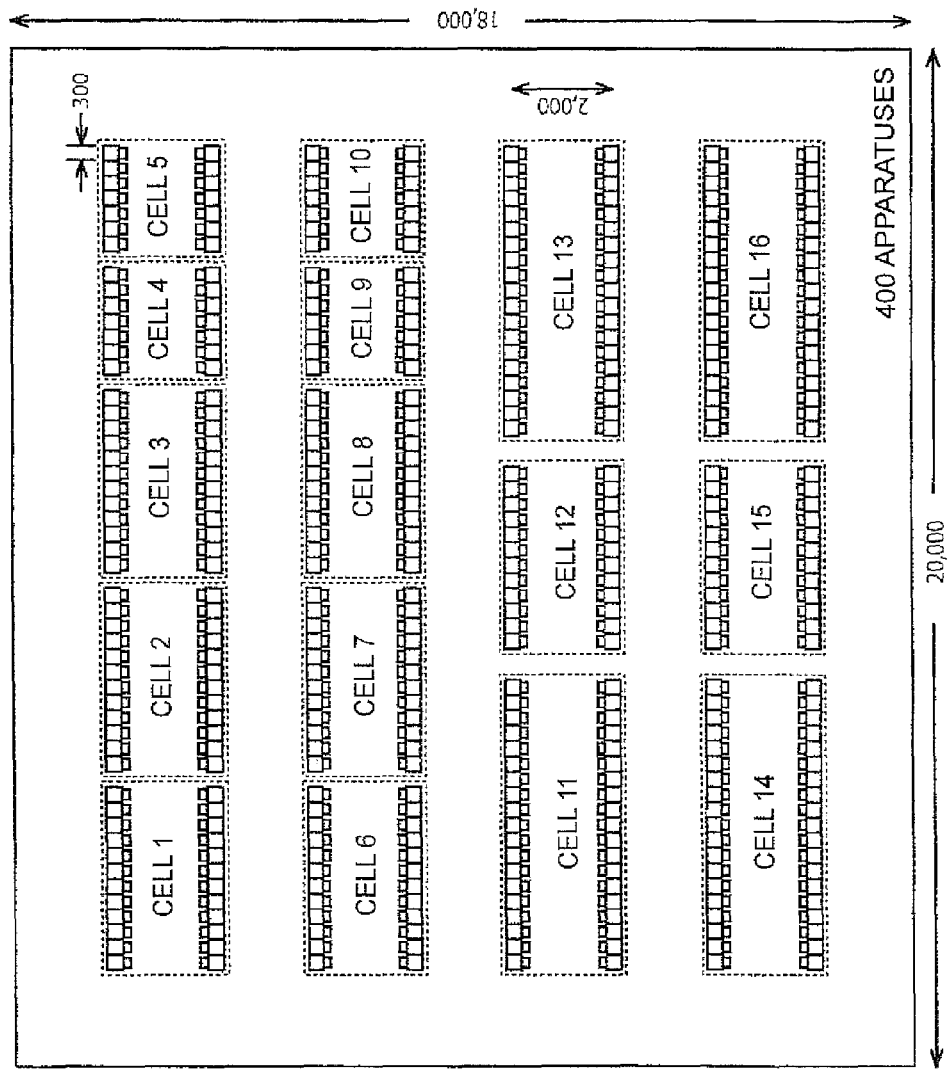
FIG. 6 is an exemplary arrangement (in a multicell shop layout) in the job shop system of the manufacturing line according to the exemplary embodiment of the present invention.

The present invention realizes it by the multicell shop system in FIG. 6. This multicell shop includes a large number of (multiple) cell shops described above, and the number of product types which can be manufactured is equal to the number of cells. In the case where the number of product types may be small, only the necessary cell shops have to be operated. This is far efficient than operating the entire flow shop including the conveyance means.

This multicell shop is fundamentally different from the conventional cell method in the point that the layout and the manufacturing method can be flexibly and extremely easily changed between the multicell shop and the flow shop described above.

Next, assume that the small amount of product which has been manufactured in the multicell shop is accepted in a market, and then many orders are received. That is, assume that the number of the unit of manufacturing (number of orders) is approximately several hundreds. In this case, the number of the unit process apparatuses 1 is nearly equal to the number of the semiconductor devices to be manufactured.

Figure 5:
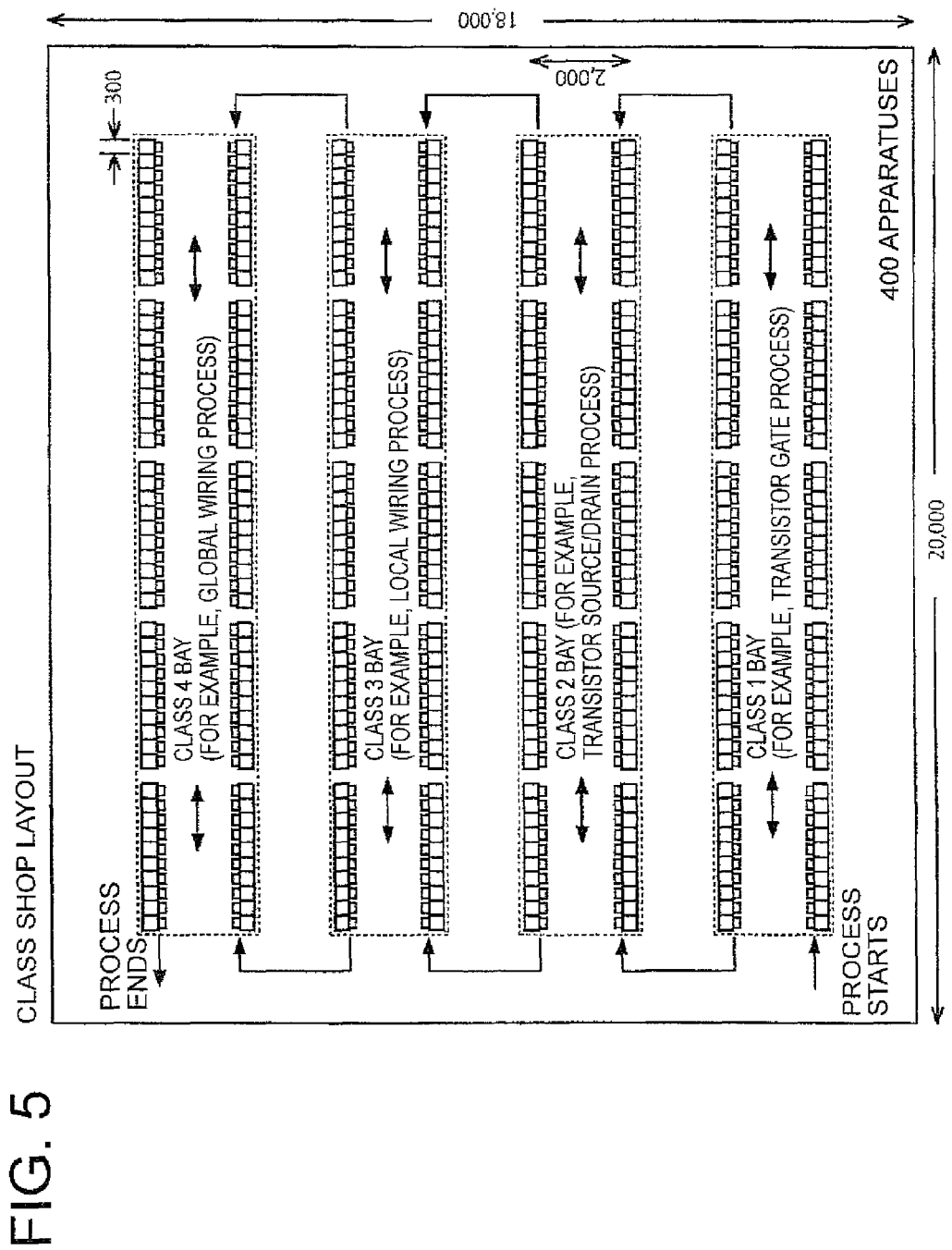
FIG. 5 is an exemplary arrangement (in a class shop layout) in a job shop system of the manufacturing line according to the exemplary embodiment of the present invention.

In this case, the multicell shop layout can be extremely easily changed to the class cell shop layout in FIG. 5. In this class shop layout, many types of products can be simultaneously manufactured.

In this case, the unit process apparatus group is roughly divided into, for example, four groups, from the upper process (starting side) toward the lower process (ending side) of the manufacturing processes. The first process group is a transistor gate process (class 1 bay), and a transistor source/drain process (class 2 bay) follows. Then a local wiring process (class 3 bay) follows, and a global wiring process (class 4 bay) is lastly arranged. In the case of a system LSI device, each process includes approximately 100 processes, and in each class bay approximately 100 unit process apparatuses are arranged. In the rough division according to the procedure for manufacturing, once a class process is finished and the wafer to be processed is conveyed to the next class, the wafer can no longer return to the previous class. That is, the wafer is conveyed to class 1, class 2, class 3, and class 4 in this order.

This class shop layout is a new production method for a semiconductor device. At the major division level of processes, it can be seen as the flow shop. On the other hand, inside the class, the wafer comes and goes between various apparatuses. Thus, it cannot be seen as the flow shop. Inside one class bay, the job shop layout, which arranges the unit process apparatuses by type, may be employed.

In the case where a wafer is conveyed by hand, this job shop layout has an advantage that the unit process apparatuses which are available and not manufacturing can be easily identified on the spot, because the manufacturing apparatuses of the same type are arranged closely together. That is, the traffic line of people can be minimized. In the case where a wafer is conveyed by machine, especially in the case where the next unit process apparatus is determined using information from the RFID, a method to intentionally arrange the unit process apparatuses for different types of process in a comparatively random manner may be employed. This minimizes the physical conveyance distance of a wafer and shortens the turnaround time.

As described above, the present invention assumes that a plant includes 400 unit process apparatuses and has a size of, for example, 20 m×18 m as illustrated in FIG. 4, FIG. 5, and FIG. 6. Completely without changing the number of apparatuses, the three layouts of the flow shop for mass production, the class shop for middle amount production, and the multicell shop for small amount production can be flexibly changed depending on the number of orders of products.

Such flexibility has not been achieved by any conventional megafabs. It is mainly achieved with the minimized unit of wafers, the small unit process apparatus groups which are standardized for the wafers, various structures which allow the unit process apparatus to be conveyable, and the factory system which allows the layout of apparatuses according to the present invention.

There are two criteria to determine a change of layout between the flow shop and the class shop.

One criterion for the determination is the case where the number of the unit of manufacturing has been decreasing to be nearly equal to the number of processes in the flow shop. If the number of the unit of manufacturing is nearly equal to the number of processes, the unit process apparatus which has finished the process for the last wafer enters into a resting state. It takes twice as long as the processing time for one wafer, after the first wafer is introduced to the fab until the final process for the last wafer is completed. That is, when the number of the unit of manufacturing is equal to the number of the unit process apparatuses, the operation rate of the apparatuses is reduced to 50% on average. After the last wafer is finished, the layout of the apparatuses is changed in the order of a process recipe for a new product type to prepare to manufacture the next different product type. When the operation rate of the apparatuses becomes less than 50%, the productivity of the plant suffers the serious negative effect. In such a case, the class shop layout is advantageous where many types of products can be simultaneously manufactured. More specifically, when the number of the unit of manufacturing is less than the number of the unit process apparatuses even if only slightly, the unit process apparatus cannot be in full operation (100% operation) at any given moment during manufacturing. This is very disadvantageous to operate the plant. Accordingly, the number of the unit of manufacturing which is nearly equal to the number of the unit process apparatuses is the lower limit value for the flow shop.

The other criterion for the determination is the case where two or more product types are simultaneously manufactured. In this case, it is impossible to simultaneously flow two product types in the order of the process recipe in the flow shop in principle.

However, in some cases, the process recipes of two product types are extremely similar to each other. This is a common case in an actual LSI process or other processes. For example, in the case where the content of only one process in 400 processes is different, two unit process apparatuses for the two different processes may be continuously arranged. In this arrangement, only the required unit process apparatus may be selected while the unit process apparatus that is not selected may be skipped. In this case, the number of the unit process apparatuses increases by one to be 401. In the case of this example, two product types can be manufactured in flow shop layout. Accordingly, the flow shop can manufacture multiple product types by increasing the number of the unit process apparatus and inserting the apparatus which is not used for all product types to add a little redundancy.

Next, the criterion to determine a change of layout between the class shop layout and the multicell shop layout is described.

The class shop system is advantageous in the case where there are multiple product types of products which are manufactured in approximately the same type of process. Accordingly, in the case of prototyping, manufacturing a completely new device, manufacturing multiple types of devices which differ substantially in the number of processes, or manufacturing multiple product types simultaneously, it is difficult to employ the class shop layout, and the multicell shop is effective.

It is easy to fix the process condition of the unit process apparatus in the flow shop layout and the class shop layout. In the multicell shop layout, the process condition is changed for each cell as necessary to manufacture a wide variety of product types.

As described above, the present invention allows facilitating the reconstruction of the optimal manufacturing line as necessary depending on the number of the unit of manufacturing (number of orders), the recipe required to process the unit of manufacturing, or the number of the unit process apparatuses. This reconstruction causes little cost.

The manufacturing line thus reconstructed can manufacture even one semiconductor, and can also manufacture hundreds of thousands to millions of semiconductors (in the case of multiple manufacturing lines) per month. The so-called variable-product variable-quantity production can be efficiently performed, and the appropriate quality can be also kept at the same time. Thus, this can easily meet the needs of manufacturing semiconductors from a research and development phase to a large-scale production phase.

That is, in the case where the number of the unit of manufacturing is very small, for example, in the case where the number of orders is one, one cell shop can meet the needs. That is, in an early phase of product manufacturing, especially in a prototyping phase or other phases, in the case where the number of orders is less than the number of the unit process apparatuses or in the case where the number of orders becomes far less than the number of the unit process apparatuses, semiconductors are manufactured in the cell shop or the multicell shop.

Then, if the number of orders for a certain product type or some product types increases and becomes nearly equal to the number of the unit process apparatuses, the layout can be changed to the class cell shop arrangement where the manufacturing speed is faster.

Furthermore, if the number of orders for a single product type increases and only the product type is manufactured, the layout can be changed to the flow shop arrangement, where the unit process apparatuses are arranged in the order of the processing procedure (process recipe) of the product type. This can further improve the manufacturing speed.

In the case where the received orders exceed the manufacturing capacity of one flow shop, the flow shop is extended as a parallel flow shop system, where flow shops are arranged in parallel. This allows manufacturing semiconductors corresponding to the number of orders.

In the present invention, the number of the unit process apparatuses and the required floor space of the plant does not vary among three layouts of the flow shop, the class shop, and the multicell shop. That is, even though the number of the unit of manufacturing and the number of manufacture types vary, the shop layout arrangement can be changed such that the number of the unit process apparatuses and the area of the plant completely remain the same. This is a great advantage that a new investment is not required at all for major changes of the number of products to be manufactured and the number of types of products.

In the exemplary embodiment, each unit process apparatus 1 has the standardized outline. This facilitates conveyance of the unit process apparatus 1, a positioning task on the guideway 2, or similar tasks, which are associated with a layout change. The connection between each unit process apparatus 1 and the wafer entry/exit front chamber 5 and the configuration for coupling each unit process apparatus 1 with the post 6 can also be standardized. This provides superior cost performance as a device manufacturing system. A conveyance control of the conveyance means 4 to convey the sealed conveyance container 3 and an operation control of the layout apparatus 7 can also be simplified.

Additionally, this allows the standardization of configuration for an arrangement of the unit process apparatuses in a plant. This and other factors ensure the reduced cost for the entire device manufacturing system.

As described above, each unit process apparatus has the standardized outline in the exemplary embodiment described above in order to satisfy the requirement for facilitating rearrangement of the unit process apparatuses or other requirements. For example, due to the amount of raw materials required for the unit process apparatus and wastes, it is difficult to standardize its outline. In this case, it is preferred that accessory units such as the processing apparatus for the raw materials and wastes have their own outlines which meet the same standard as the unit process apparatus. The accessory units are preferred to be arranged adjacent to the unit process apparatus so as to standardize the outline of the arranged unit when possible.

However, in the case where it is still difficult to downsize the unit process apparatus itself even with the above-described method, the size of the unit process apparatus is defined to be the integral multiple of standardization. This facilitates the layout of the apparatuses in the plant.

In the case where it is still difficult to downsize or standardize even with the above-described method, in the case where the manufacturing cost of the unit process apparatuses becomes high due to downsizing or standardization, or in the case where necessary apparatuses required for manufacturing devices are not standardized, those apparatuses can be inserted to the unit process apparatus group and be used.

The insertion of those unstandardized apparatus to the layout slightly decreases the layout efficiency and the conveyance efficiency. However, in the case where those apparatuses are required, those apparatuses are allowed to be used. In the present invention, it is not necessarily required that outlines of all processing apparatuses in the layout are standardized. In the case where such an irregular processing apparatus is disposed, a loss of the conveyance efficiency can be minimized by disposing this apparatus at an end of a queue of processing apparatuses when possible.

In the exemplary embodiment described above, the layout apparatus 7 is used to automatically change the layout of the unit process apparatuses 1. However, the layout can be changed by hand depending on the needs of rearrangement because the unit process apparatus 1 has a shape and weight that allows moving by hand. Accordingly, assuming that the layout is thus changed, the layout apparatus 7 may be omitted.

In the exemplary embodiment described above, the raw material gas or the like to be consumed in the unit process apparatus 1 is supplied from outside of the unit process apparatus 1 through the piping connector 1g. However, each unit process apparatus 1 may be configured to have a necessary supply source without being supplied from outside as described above.

It is preferred to be thus configured because the portability of the unit process apparatus itself is improved and the piping system in the manufacturing line is simplified.

While in the exemplary embodiment described above, the wafer stored in the sealed conveyance container 3 has a diameter of 0.5 inch as the wafer size for manufacturing one semiconductor device of 1 cm$^2$, the wafer size is not limited to this size. The wafer size may be larger or smaller than this size, insofar as the single processing apparatus 1 of the above-described desktop size can process one sheet by one sheet of the wafer using the single wafer processing. The number of chips in the minimized unit, which are manufactured from those wafers, is not limited to one and may be two or more. The number of chips depends on the size of the device to be manufactured.

In the exemplary embodiment described above, the example of manufacturing processes for the final product of the semiconductor device is described. However, the exemplary embodiment is not specifically limited to manufacturing the final product, and may be configured to process only the processes in the middle of the semiconductor manufacturing processes. In such a case, similarly to the exemplary embodiment described above, the number of the unit process apparatuses are determined based on the number of single processes in those processes, and then an efficient shop layout is selected and configured based on the number of the unit of manufacturing.

While in the exemplary embodiment described above the example of manufacturing semiconductor devices is described, this is not specifically limited to manufacturing semiconductor devices. This may be configured as a system for manufacturing metal-based accurate instruments/devices, insulator-based accurate instruments/devices, and devices made of various materials such as bio-related materials.

In such a case, similarly to the exemplary embodiment described above, processing apparatuses corresponding to various kinds of physical processes, chemical processes, and biological processes, which are required for the manufacturing processes of those devices, are incorporated as the unit process apparatuses to perform the processes.

Furthermore, the present invention also has an effect in the case of manufacturing a hybrid of the semiconductor device according to the above-described exemplary embodiment and at least one device based on various materials other than the semiconductor described above. Especially, in the case where a combined device, which is made by combining devices made of various materials described above, is manufactured, an efficient shop layout is selected and configured based on the number of processes, which are unique to each material category, and the number of the unit of manufacturing described above.

Specifically, a reaction device, in particular a microchemical system, a microchemical reactor, an etching apparatus, a growing equipment, a processing equipment, a sterilizing equipment, a particle size filter, an artificial light source, a biological equipment, a food processing equipment, an inspection equipment, a medical device, endoscope parts, a contact lens manufacturing equipment, a dialysis equipment, a medical disposal manufacturing equipment, a pharmaceutical equipment, or other equipments can be introduced as a connecting element.

In the case where a system is configured using the connecting element, processes for various materials can be easily performed at low cost with high flexibility. The system covers total sequence of the process flow in the fields of the nanotechnology, the biological technology, the plant factory technology, or similar technologies. Various elements including inorganic materials, organic materials, or biological materials can be easily performed at low cost with high flexibility, covering total sequence of the process flow.

In the cell shop illustrated in FIG. 8, there is no need for the clean room. Furthermore, the installation space may be extremely small. This manufacturing system is at a low price and the operation cost is small. This manufacturing system can be easily established in a university or a research institution. This manufacturing system can be freely rearranged as necessary. An individual research result can be easily introduced to this actual manufacturing system. This and other factors make this manufacturing system be very useful.

REFERENCE SIGNS LIST

1 unit process apparatus
1*a* main processing unit
1*b* unit process apparatus side connector portion
1*c* guiding portion
1*d* apparatus upper portion
1*e* apparatus lower portion
1*f* upper and lower coupling spacer
2 guideway
3 sealed conveyance container
4 conveyance means
5 wafer entry/exit front chamber
5*a* docking port
6 post
7 layout apparatus

What is claimed:

1. A device manufacturing system, comprising:
a plurality of predetermined processing apparatuses that are movable and respectively have sealed-type processing sections which shut off external air for performing predetermined processes of a plurality of manufacturing processes used for manufacturing a predetermined device;
a sealed type container operatively associated with said plurality of predetermined processing apparatuses for conveyance which stores a wafer to be processed by the plurality of predetermined processing apparatuses and shuts off external air for conveying the wafer among the plurality of predetermined processing apparatuses; and
sealed type wafer entry/exit front chambers that are mounted respectively to the same positions of the respective predetermined processing apparatuses, respectively configure a part of the respective predetermined processing apparatuses, and shut off external air for passing the wafer between the processing section and the container for conveyance,
wherein: the predetermined processing apparatuses are identical in outside shape to each other; and the wafer entry/exit front chambers are identical in wafer-passing mechanism and outside shape to each other.

2. The device manufacturing system according to claim 1, wherein:
the container for conveyance is a container storing a wafer; and
the wafer has a wafer size that can fabricate one device.

3. The device manufacturing system according to claim 2, wherein:
the wafer has the wafer size of 0.5 inches in diameter.

4. The device manufacturing system according to claim 1, wherein:
the container for conveyance is configured to be opened and closed,
the wafer entry/exit front chambers respectively have a docking port which is disposed on an upper portion of the wafer entry/exit front chamber and removably mounted on the wafer entry/exit front chamber when the container for conveyance is placed,
the wafer entry/exit front chambers are standardized, and
when the container for conveyance is placed on the docking port, the wafer stored in the container for conveyance is carried from the container for conveyance to the processing section by the wafer-passing mechanism in a sealed condition.

5. The device manufacturing system according to claim 4, wherein:
the container for conveyance includes a protrusion for positioning the container for conveyance on the docking port.

6. The device manufacturing system according to claim 1, wherein
conveyance means operatively associated with the container for conveyance and configured to convey the container for conveyance between the wafer entry/exit front chambers which are disposed for each of the predetermined processing apparatuses is provided.

7. A device manufacturing apparatus, comprising:
a plurality of predetermined processing apparatuses that are movable and respectively have sealed-type processing sections which shut off external air for performing predetermined processes of a plurality of manufacturing processes used for manufacturing a predetermined device;
a sealed type container operatively associated with said plurality of predetermined processing apparatuses for conveyance which stores a wafer to be processed by the plurality of predetermined processing apparatuses and shuts off external air for conveying the wafer among the plurality of predetermined processing apparatuses; and
a sealed type wafer entry/exit front chamber mounted to each of the plurality of predetermined processing apparatuses, configuring a part of the respective predetermined processing apparatuses, and shutting off external air for passing the wafer between the processing section and the container for conveyance,
wherein: the wafer stored in the sealed type container for conveyance has a wafer size that can fabricate one device; and
on the basis of a number of products when manufacturing the devices continuously and a number of the predetermined processing apparatuses, when the number of products is larger than the number of predetermined processing apparatuses, the plurality of the predetermined processing apparatuses is arranged as a flow shop system for arrangement corresponding to an order of processes for the device, when the number of products is equal to the number of predetermined processing apparatuses, the plurality of the predetermined processing apparatuses is arranged as a class shop system for classified arrangement from one large classification based on the order of the processes to another, and when the number of products is less than the number of predetermined processing apparatuses, the plurality of the predetermined processing apparatuses is arranged as a multicell shop system in which approximately one of the predetermined processing apparatuses is placed in a cell for each type of processing, the multicell shop system having a plurality of cells for manufacturing a predetermined device and configuring the plurality of predetermined processing apparatuses, which is configured to be able to manufacture multiple types of products in accordance with a number of the plurality of cells.

\* \* \* \* \*